(12) United States Patent
Wu

(10) Patent No.: US 10,803,822 B2
(45) Date of Patent: Oct. 13, 2020

(54) PIXEL DRIVE CIRCUIT OF DISPLAY PANEL AND DISPLAY DEVICE

(71) Applicants: HKC CORPORATION LIMITED, Shenzhen (CN); CHONGQING HKC OPTOELECTRONICS TECHNOLOGY CO., LTD., Chongqing (CN)

(72) Inventor: Chuan Wu, Chongqing (CN)

(73) Assignees: HKC CORPORATION LIMITED, Shenzhen (CN); CHONGQING HKC OPTOELECTRONICS TECHNOLOGY CO., LTD., Chongqing (CN)

(*) Notice: Subject to any disclaimer, the term of this patent is extended or adjusted under 35 U.S.C. 154(b) by 0 days.

(21) Appl. No.: 16/320,481

(22) PCT Filed: Nov. 6, 2018

(86) PCT No.: PCT/CN2018/114064
§ 371 (c)(1),
(2) Date: Jan. 25, 2019

(87) PCT Pub. No.: WO2020/073396
PCT Pub. Date: Apr. 16, 2020

(65) Prior Publication Data
US 2020/0111432 A1 Apr. 9, 2020

(30) Foreign Application Priority Data
Nov. 6, 2018 (CN) .......................... 2018 2 1629477

(51) Int. Cl.
G09G 3/36 (2006.01)
G02F 1/1343 (2006.01)
H01L 27/12 (2006.01)

(52) U.S. Cl.
CPC ......... *G09G 3/3648* (2013.01); *G02F 1/1343* (2013.01); *H01L 27/1218* (2013.01); *G09G 2310/0264* (2013.01)

(58) Field of Classification Search
CPC .. G09G 3/3258; G09G 3/3233; G09G 3/3648; G09G 2310/0264; G02F 1/1343; G02F 1/13624; H01L 27/1218
See application file for complete search history.

(56) References Cited

U.S. PATENT DOCUMENTS

| 6,064,362 A * | 5/2000 | Brownlow ......... G02F 1/13624 345/98 |
| 2010/0141645 A1* | 6/2010 | Choi .................... G09G 3/3233 345/214 |

(Continued)

FOREIGN PATENT DOCUMENTS

| CN | 101988992 A | 3/2011 |
| CN | 105469743 A | 4/2016 |

(Continued)

OTHER PUBLICATIONS

Rong Zhou, the ISA written comments, Jul. 2019, CN.

*Primary Examiner* — Richard J Hong

(57) ABSTRACT

This application discloses a pixel drive circuit of a display panel and a display device. The pixel drive circuit of a display panel includes: a pixel electrode; a data line, configured to provide a data voltage of a current pixel; a power supply circuit, configured to provide a power supply voltage; and an amplification circuit, configured to amplify the data voltage provided by the data line and output the amplified data voltage to the pixel electrode.

5 Claims, 4 Drawing Sheets

(56) References Cited

U.S. PATENT DOCUMENTS

| | | | | |
|---|---|---|---|---|
| 2011/0254883 A1* | 10/2011 | Tsai | ................... | G09G 3/3233 |
| | | | | 345/691 |
| 2015/0220201 A1* | 8/2015 | Wu | ................... | G09G 3/3258 |
| | | | | 345/173 |
| 2016/0365031 A1* | 12/2016 | Wu | ................... | G09G 3/3258 |
| 2017/0018229 A1* | 1/2017 | Zhang | ................ | G09G 3/3233 |
| 2017/0140704 A1* | 5/2017 | Cai | ................... | G09G 3/3258 |
| 2018/0040277 A1* | 2/2018 | Cai | ................... | G09G 3/3258 |
| 2018/0218680 A1* | 8/2018 | Cai | ................... | G09G 3/3233 |

FOREIGN PATENT DOCUMENTS

| | | |
|---|---|---|
| CN | 108269537 A | 7/2018 |
| KR | KR20150077171 A | 7/2015 |

* cited by examiner

PIXEL DRIVE CIRCUIT OF DISPLAY PANEL AND DISPLAY DEVICE

This application claims priority to Chinese Patent Application No. CN201821629477.6, filed with the Chinese Patent Office on Oct. 8, 2018 and entitled "PIXEL DRIVE CIRCUIT OF DISPLAY PANEL AND DISPLAY DEVICE", which is incorporated herein by reference in its entirety.

TECHNICAL FIELD

This application relates to the field of display technologies, and in particular, to a pixel drive circuit of a display panel and a display device.

BACKGROUND

The description herein provides only background information related to this application, but does not necessarily constitute the existing technology.

With the development and advancement of science and technologies, flat-panel displays become mainstream products of displays and are widely applied contributing to hotspot features such as thinness, power saving and low radiation. The flat-panel display includes a thin film transistor-liquid crystal display (TFT-LCD), an organic light-emitting diode (OLED) display, and the like. The TFT-LCD controls rotation directions of liquid crystal molecules and refracts out light of a backlight module to generate an image, and has many advantages such as thinness, power saving and no radiation. The OLED display is made of an organic electroluminescent light-emitting diode and has such advantages as self-luminance, a quick response, a high definition and contrast, and a capability of achieving flexible display and a large-area full color display.

A display panel is a voltage-driven component. However, in the technologies well know in the art, there is rarely displaying-drive architecture by using which a penetration rate of the display panel is increased and power consumption is reduced, and thus an optimal displaying effect cannot be achieved.

Technical Problem

Display panels have relatively large drive architecture power consumption and a low panel penetration rate.

SUMMARY

This application provides a pixel drive circuit of a display panel and a display device that are drive architectures enabling a voltage applied to a pixel electrode to be greater than a voltage of a data line, to increase a penetration rate of the display panel and reduce power consumption.

To achieve the foregoing objectives, this application provides a pixel drive circuit of a display panel, comprising:
a pixel electrode;
a first scanning line, configured to provide a first scanning signal corresponding to a current pixel;
a data line, configured to provide a data voltage of the current pixel in cooperation with the first scanning signal;
a power supply circuit, configured to provide a power supply voltage; and
an amplification circuit, electrically connected to the data line and the power supply circuit, wherein an output end of the amplification circuit is electrically connected to the pixel electrode, and the amplification circuit amplifies the data voltage provided by the data line and outputs the amplified data voltage to the pixel electrode.

This application further discloses a pixel drive circuit of a display panel, comprising:
a pixel electrode;
a first scanning line, configured to provide a first scanning signal corresponding to a current pixel;
a second scanning line, configured to provide a second scanning signal corresponding to the current pixel;
a power supply voltage line, configured to provide a power supply voltage;
a data line, configured to provide a data voltage of the current pixel in cooperation with the first scanning signal; and
a first switch circuit, a second triode, and a third switch circuit, wherein
a gate end of the first switch circuit is in control connection with the first scanning signal; a source end of the first switch circuit is electrically connected to the data line; and a drain end of the first switch circuit is connected to a gate end of the second triode;
a source end of the second triode is electrically connected to the power supply voltage line, and a drain end of the second triode is electrically connected to a source end of the third switch circuit;
a gate end of the third switch circuit is in control connection with the second scanning signal, and a drain end of the third switch circuit is electrically connected to an input end of the pixel electrode; and
a first capacitor is formed between the drain end of the first switch circuit and the drain end of the second triode.

This application further discloses a display device, comprising:
a display panel comprising the pixel drive circuit according to any one of the foregoing aspects; and
a drive module, configured to drive the display panel, wherein
the drive module outputs a first scanning signal, a power supply voltage, and a data voltage to the display panel; and
in a scanning period of a row of pixels on the display panel, the first scanning signal output by the drive module is at a high level and provides the data voltage of the current pixel to the amplification circuit in cooperation with the data voltage of the data line; and the power supply voltage of the power supply circuit is at a high level and supplies power to the amplification circuit, and the amplification circuit amplifies the data voltage and outputs the amplified data voltage to the pixel electrode.

Compared with other technologies well known in the art, according to this application, the first scanning line outputs the first scanning signal corresponding to the current pixel, and the data line inputs a signal of the data voltage and provides the data voltage of the current pixel in cooperation with the first scanning signal. When the data voltage is input, the power supply circuit correspondingly enables a high level and supplies power to the amplification circuit, and in this case, the data voltage input by the data line is output to the pixel electrode by using the amplification circuit, to provide a higher pixel driving voltage to drive the pixel electrode. An improvement is made in this solution based on the technology well known in the art. Based on such an improvement, the pixel driving voltage is greater than the data voltage of the data line, a penetration rate of the panel is increased, and power consumption is reduced, so that a driving voltage applied to the pixel electrode may be greater than the driving voltage of the data line, thereby ensuring a displaying effect.

BRIEF DESCRIPTION OF DRAWINGS

The accompanying drawings included are used to provide an understanding of the embodiments of this application. The accompanying drawings constitute a part of the specification, illustrate examples of implementations of this application, and explain the principle of this application together with the text description. Apparently, the accompanying drawings in the following descriptions are merely some embodiments of this application, and a person of ordinary skill in the art can alternatively obtain other accompanying drawings according to these accompanying drawings without involving any creative effort. In the accompanying drawings.

DETAILED DESCRIPTION

Figure 1:
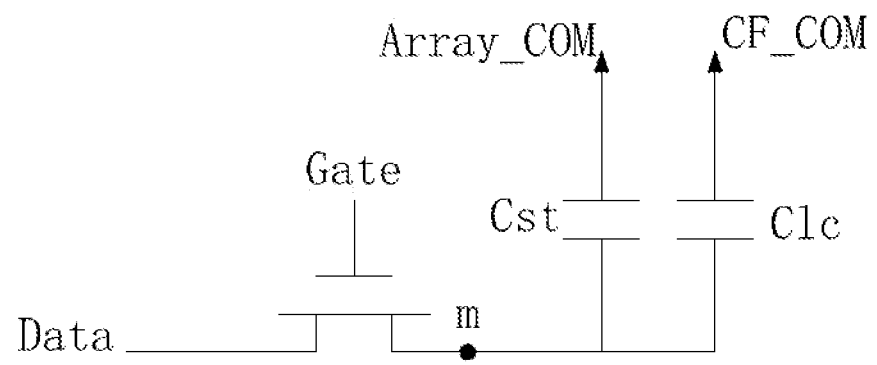
FIG. 1 is a schematic diagram of a drive architecture of a display panel according to an embodiment of this application.
Figure 2:
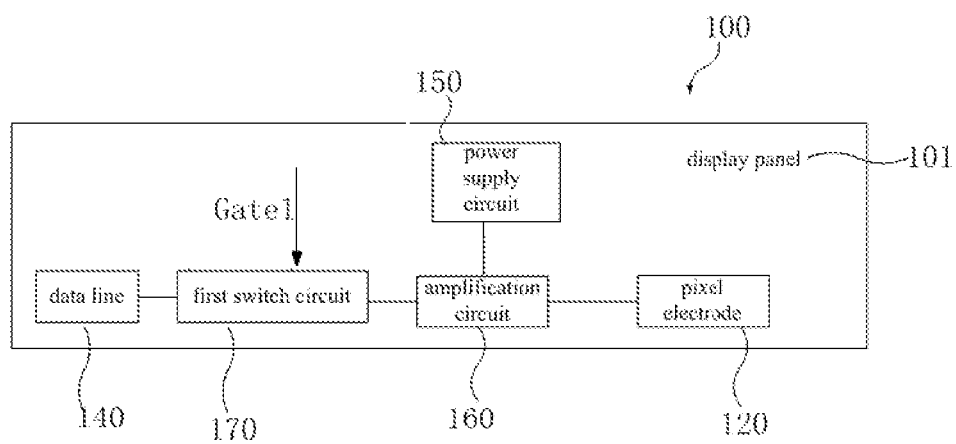
FIG. 2 is a schematic diagram of modules of a pixel drive circuit according to an embodiment of this application.

Specific structures and functional details disclosed herein are merely representative, and are intended to describe the objectives of the exemplary embodiments of this application. However, this application may be specifically implemented in many alternative forms, and should not be construed as being limited to the embodiments set forth herein.

In the description of this application, it should be understood that orientation or position relationships indicated by the terms such as "center", "transverse", "on", "below", "left", "right", "vertical". "horizontal", "top", "bottom", "inside", and "outside" are based on orientation or position relationships shown in the accompanying drawings, and are used only for ease and brevity of illustration and description, rather than indicating or implying that the mentioned apparatus or component must have a particular orientation or must be constructed and operated in a particular orientation. Therefore, such terms should not be construed as limiting of this application. In addition, the terms such as "first" and "second" are used only for the purpose of description, and should not be understood as indicating or implying the relative importance or implicitly specifying the number of the indicated technical features. Therefore, a feature defined by "first" or "second" can explicitly or implicitly includes one or more of said features. In the description of this application, unless otherwise stated, "a plurality of" means two or more than two. In addition, the terms "include", "comprise" and any variant thereof are intended to cover non-exclusive inclusion.

In the description of this application, it should be noted that unless otherwise explicitly specified or defined, the terms such as "mount", "install", "connect", and "connection" should be understood in a broad sense. For example, the connection may be a fixed connection, a detachable connection, or an integral connection; or the connection may be a mechanical connection or an electrical connection; or the connection may be a direct connection, an indirect connection through an intermediary, or internal communication between two components. Persons of ordinary skill in the art may understand the specific meanings of the foregoing terms in this application according to specific situations.

The terminology used herein is for the purpose of describing specific embodiments only and is not intended to be limiting of exemplary embodiments. As used herein, the singular forms "a", "an" and "the" are intended to include the plural forms as well, unless the context clearly indicates otherwise. It should be further understood that the terms "include" and/or "comprise" when used in this specification, specify the presence of stated features, integers, steps, operations, circuits, and/or components, but do not preclude the presence or addition of one or more other features, integers, steps, operations, circuits, components, and/or combinations thereof.

This application is described below with reference to the accompanying drawings and optional embodiments.

As shown in FIG. 2 to FIG. 6, this application discloses a display device 100, including: a display panel 101 and a drive module that is configured to drive the display panel 101.

A pixel drive circuit 110 of the display panel 101 includes: a pixel electrode 120; a first scanning line, configured to provide a first scanning signal Gate 1 corresponding to a current pixel; a data line 140, configured to provide a data voltage $V_{Data}$ of the current pixel in cooperation with the first scanning signal Gate 1; a power supply circuit 150, configured to provide a power supply voltage $V_{DD}$; and an amplification circuit 160, electrically connected to the data line 140 and the power supply circuit 150, where an output end of the amplification circuit 160 is electrically connected to the pixel electrode 120, and the amplification circuit 160 amplifies the data voltage provided by the data line 140 and outputs the amplified data voltage to the pixel electrode 120.

Compared with the solution shown in FIG. 1, for the pixel drive circuit 110 in FIG. 1, a scanning line Gate signal controls a TFT switch. The TFT switch forms a storage capacitor ($C_{st}$) with a common line on an array substrate (Array_COM), and forms a pixel capacitor ($C_{lc}$) with a common line on a color film substrate (CF_COM). In a stable state, a voltage of a node m of the display panel of the pixel drive circuit 110 may maximally be equal to a voltage $V_{Data}$ of the data line 140 input by the data line 140. The first scanning line in this solution outputs the first scanning signal Gate 1 corresponding to the current pixel. The data line 140 inputs a signal of the data voltage and provides the data voltage of the current pixel in cooperation with the first scanning signal Gate 1. When the data voltage is input, the power supply circuit 150 correspondingly enables a high level and supplies power to the amplification circuit 160. In this case, the data voltage input by the data line 140 is output to the pixel electrode 120 by using the amplification circuit 160, so that a pixel drive voltage higher than the data voltage input by the data line 140 can be provided to drive the pixel electrode 120. Further, according to this solution, a voltage value on Data on the data line 140 can be dramatically reduced, and a fluctuation amplitude of the voltage on the data line 140 can be further reduced, so that the display panel 101 can satisfy power demands of the display panel 101 by amplifying a relatively small data voltage by using the amplification circuit 160 to drive the display panel 101, a penetration rate of the display panel 101 is increased, power consumption of the display panel 101 is reduced, and a drive voltage applied to the pixel electrode may be greater than a drive voltage of the data line 140, thereby ensuring a display effect.

Based on the architecture of the pixel drive circuit 110, in a scanning period of a row of pixels of the display panel 101 of the drive module, the first scanning signal Gate 1 output by the drive module is at a high level and provides the data voltage of the current pixel to the amplification circuit 160 in cooperation with the data voltage of the data line 140. A power supply voltage of the power supply circuit 150 is at a high level and supplies power to the amplification circuit 160. The amplification circuit 160 amplifies the data voltage and outputs the amplified data voltage to the pixel electrode 120.

When the drive module outputs the first scanning signal Gate 1 at the high level, the data line 140 outputs the data voltage in cooperation, and the power supply circuit 150 provides the power supply voltage at the high level to supply power to the amplification circuit 160. In this case, the amplification circuit 160 amplifies the data voltage and outputs the amplified data voltage to the pixel electrode 120, so that the drive voltage applied to the pixel electrode may be greater than the drive voltage of the data line 140, a penetration rate of the display panel 101 is increased, and power consumption is reduced.

Figure 3:
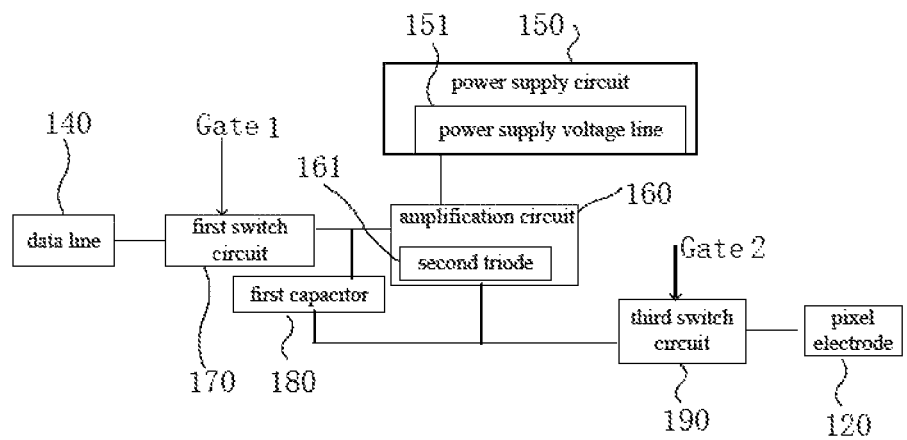
FIG. 3 is a schematic diagram of modules of a pixel drive circuit according to an embodiment of this application.

Optionally, in this embodiment, as shown in FIG. 3, the power supply circuit 150 includes a power supply voltage line 151, and the amplification circuit 160 includes a second triode 161. A gate end of the second triode 161 is in control connection with the data line 140, a source end of the second triode 161 is electrically connected to the power supply voltage line 151, and a drain end of the second triode 161 is in control connection with the pixel electrode 120. The second triode 161 may be a TFT, or other structures or circuits that have the same function.

In this solution, the amplification circuit 160 is an amplification triode, that is, the second triode $T_2$. Herein, the second triode T2 is mainly used for amplification instead of being purely used as a switch. When a signal transmitted by the data line 140 is relatively small, the signal is amplified by T2, so that the signal has sufficient energy to drive an execution mechanism to complete a particular work.

In this embodiment, optionally, the pixel drive circuit 110 further includes a first switch circuit 170. The data line 140 is electrically connected to the amplification circuit 160 by using the first switch circuit 170. The data line 140 is electrically connected to a source end of the first switch circuit 170, a drain end of the first switch circuit 170 is in control connection with the amplification circuit 160, and a gate end of the first switch circuit 170 is in control connection with the first scanning signal Gate 1 of the display panel 101. The first switch circuit 170 may be a TFT or may be other structures or circuits that have the same function.

In this solution, when the first scanning signal Gate 1 is at a high level, the first switch circuit T1 is conducted, and in this case, the data line 140 provides the data voltage corresponding to the current pixel to the amplification circuit 160, thereby implementing input of the data voltage corresponding to the current pixel by the data line 140. The first switch circuit 170 herein is directly controlled by the first scanning signal Gate 1 which controls input and cut-off of the drive circuit of the data voltage.

In this embodiment, optionally, a first capacitor C is formed between the drain end of the first switch circuit 170 and the output end of the amplification circuit 160.

In this solution, the first capacitor 180 is formed between the drain end of the first switch circuit 170 and the output end of the amplification circuit 160. According to the pixel drive circuit 110, when an input of the first scanning signal Gate 1 is at a high level, the data voltage charges the first capacitor 180, or when the first scanning signal Gate 1 is at a low level, the first capacitor 180 maintains a voltage difference between two ends of the capacitor. Therefore, when a voltage at the output end (point n) of the amplification circuit 160 is amplified, a voltage at the drain end (point m) of the first switch circuit 170 is pulled up simultaneously, and the voltage at the drain end of the first switch circuit 170 is maintained and enhanced.

Figure 4:
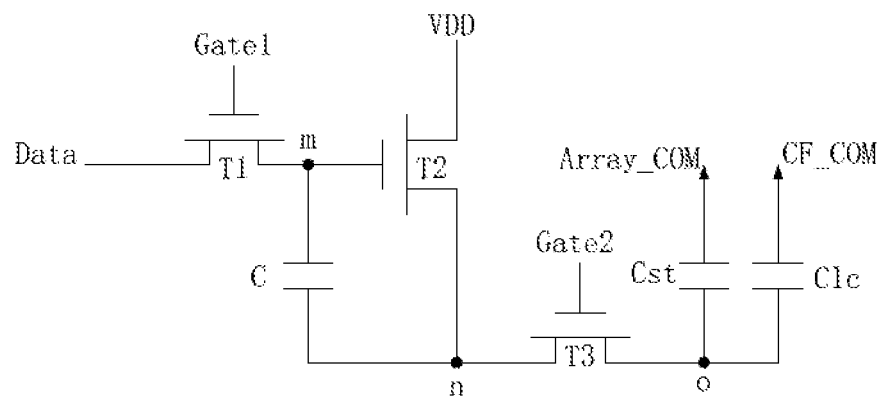
FIG. 4 is a schematic structural diagram of a pixel drive circuit according to an embodiment of this application.
Figure 5:
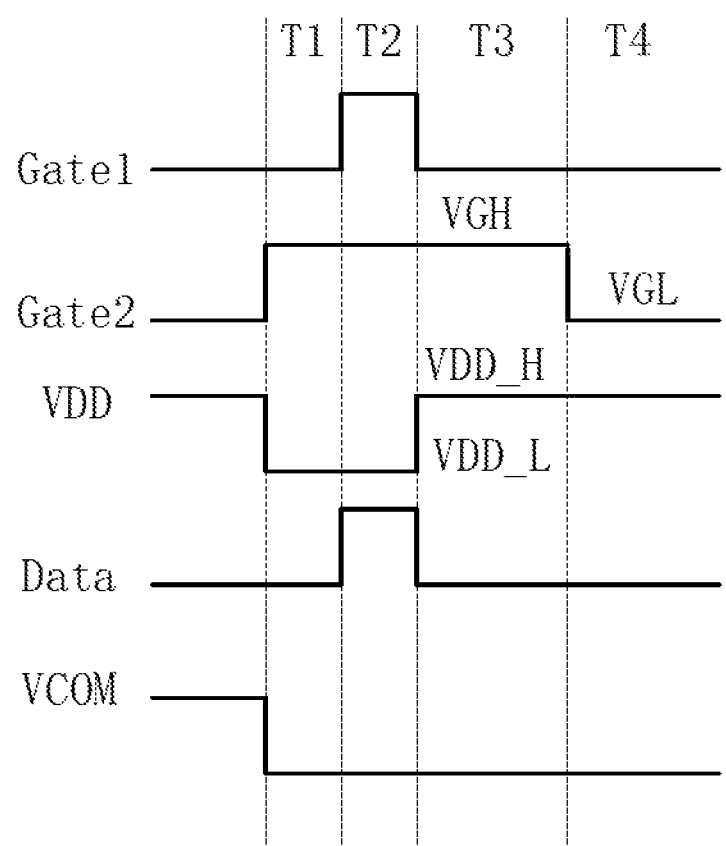
FIG. 5 is a schematic diagram of a driving time sequence according to an embodiment of this application.
Figure 6:
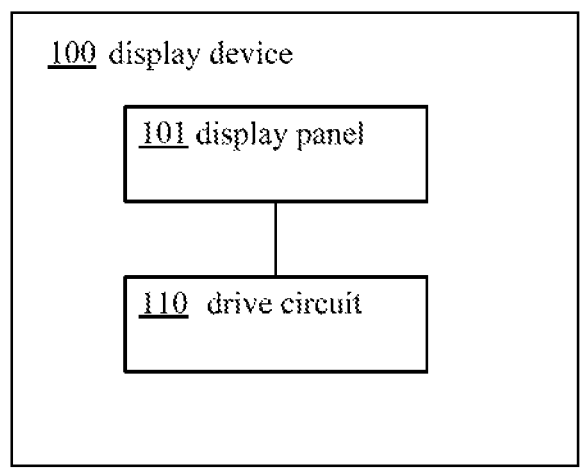
FIG. 6 is a display device according to an embodiment of this application.

Referring to FIG. 4 and FIG. 5, in another embodiment of this application, different from the foregoing embodiments, the pixel drive circuit 110 further includes: a second scanning line, configured to provide a second scanning signal Gate 2 corresponding to a current pixel; and a third switch circuit 190, where the third switch circuit 190 is connected between the output end of the amplification circuit 160 and the pixel electrode 120, a gate end of the third switch circuit 190 is electrically connected to the second scanning line, a source end of the third switch circuit 190 is electrically connected to the output end of the amplification circuit 160, and a drain end of the third switch circuit 190 is electrically connected to the pixel electrode 120. The third switch circuit 190 may be a TFT or may be other structures or circuits that have the same function.

In this solution, a switch circuit, that is, the third switch circuit T3, is arranged between the amplification circuit 160 and the pixel electrode 120. The switch circuit is disconnected from the data line 140 and the amplification circuit when a scanning period of a current row is completed, preventing the amplification circuit 160 and the data line 140 from continuously affecting the voltage of the pixel electrode 120, so that the pixel electrode 120 can maintain a pixel drive voltage higher than that related to the data voltage of the data line 140 in a frame period.

Based on the architecture of the pixel drive circuit 110, the drive module further outputs a second scanning signal Gate 2; and the scanning period of a row of pixels on the display panel 101 includes a first periodic time and a second periodic time.

In a first periodic time $T_2$, the first scanning signal Gate 1 is at a high level, and the second scanning signal Gate 2 is at a high level; the power supply voltage is at a low level; and the data line 140 outputs a data voltage corresponding to the current pixel.

In a second periodic time $T_3$, the first scanning signal Gate 1 is at a low level, the second scanning signal Gate 2 is at a high level, and the power supply voltage is at a high level.

In this solution, in the scanning period of a row of pixels, to implement that the pixel electrode 120 can maintain a pixel drive voltage higher than that related to the data voltage of the data line 140 in a frame period, work in different time segments in a period is different. In a first period $T_2$, both the first scanning signal Gate 1 and the second scanning signal Gate 2 are at a high level, the power supply voltage is at a low level, the first switch circuit 170 and the third switch circuit 190 are turned on, and the second triode 161 is pulled up to VGH and a data signal is input to the second triode 161 at the same time. In this case, a voltage at the node m is $V_m=V_{Data}$, voltages at the nodes n and o are $V_n=V_o=V_{DD\_L}$, and a voltage of the first capacitor 180C is $V_c=V_{Data}-V_{DD\_L}$. At the time $T_3$, the voltage is at a pulled-up stage, and in this case, the first scanning signal Gate 1 is at a VGL, T1 is turned off, the second scanning signal Gate 2 is at VGH, and T3 remains in a turned-on state. In this case, the node m is in a floating state, VDD is pulled up from VDD_L to VDD_H, and a current flowing through T2 is $I_2=k(V_{Data}-V_{DD\_L}-V_{th2})$;

The voltages of the nodes m/n/o are respectively.

$$V_m = \frac{k(V_{Data} - V_{DD\_L} - V_{th2})^2 \times T_3}{C_{st} + C_{lc}} + V_{Data}$$

$$V_n = V_o = \frac{k(V_{Data} - V_{DD\_L} - V_{th2})^2 \times T_3}{C_{st} + C_{lc}} + V_{DD\_L}$$

In this embodiment, optionally, the scanning period of a row of pixels on the display panel 101 includes an initialization period $T_1$ set before the first periodic time. In the initialization period $T_1$, the first scanning signal Gate 1 output by the drive module is at a low level, and the second scanning signal Gate 2 is at a high level.

In this solution, there is further an initialization period before the first periodic time of the scanning period of the row of pixels on the display panel 101, an initialization action is performed in this period, and in this case, T3 is turned on, T1 is turned off, and the node m is at a high level when a previous frame ends. In this case, the second triode 161 is enabled, and a low level signal $V_{DD\_L}$ is input to the power supply voltage. In the initialization period, the voltages of the nodes n/o are $V_n=V_o=V_{DD\_L}$. The power supply voltage signal $V_{DD}$ is sent by a control chip on the drive module to directly control a high/low level of the display panel 101, where the drive module is electrically connected to the display panel 101 by using a separate lead.

In this embodiment, optionally, the scanning period of a row of pixels on the display panel 101 further includes a third periodic time $T_4$ set after the second periodic time. In the third periodic time $T_4$, the first scanning signal Gate 1 is at a low level, and the second scanning signal Gate 2 is at a low level.

In this solution, in the third periodic time $T_4$, both the first scanning signal Gate 1 and the second scanning signal Gate 2 output by the drive module are at a low level VGL, and T1 and T3 are both turned off. In this case, the voltage of the node m is at a high potential to enable T2 to be turned on, and the node n may be charged to $V_{DD\_H}$ by T2 that is turned on, so that in this case, the node o can still remain at a high potential after T3 is turned off.

In this embodiment, optionally, the scanning period of a row of pixels on the display panel 101 further includes a third periodic time $T_4$ set after the second periodic time $T_3$. In the third periodic time $T_4$, the first scanning signal Gate 1 output by the drive module is at a low level and the second scanning signal Gate 2 is at a low level.

In this solution, in the third periodic time, both the first scanning signal Gate 1 and the second scanning signal Gate 2 are at a low level VGL, and T1 and T3 are both turned off. In this case, the voltage of the node m is at a high potential to enable T2 to be turned on, and the node n may be charged to $V_{DD\_H}$ by T2 that is turned on, so that in this case, the node o can still remain at a high potential after T3 is turned off.

In still another embodiment of this application, referring to FIG. 4 to FIG. 5, a pixel drive circuit 110 of a display panel 101 is disclosed. The pixel drive circuit 110 of the display panel 101 includes: a pixel electrode 120; a first scanning line, configured to provide a first scanning signal Gate 1 corresponding to a current pixel; a second scanning line, configured to provide a second scanning signal Gate 2 corresponding to the current pixel; a power supply voltage line 151, configured to provide a power supply voltage; a data line 140, configured to provide a data voltage of the current pixel in cooperation with the first scanning signal Gate 1; and a first switch circuit 170, a second triode 161, and a third switch circuit 190.

A gate end of the first switch circuit 170 is in control connection with the first scanning signal Gate 1; a source end of the first switch circuit 170 is connected to the data line 140; and a drain end of the first switch circuit 170 is connected to a gate end of the second triode 161. A source end of the second triode 161 is electrically connected to the power supply voltage line 151, and a drain end of the second triode 161 is electrically connected to a source end of the third switch circuit 190. A gate end of the third switch circuit 190 is in control connection with the second scanning signal Gate 2, and a drain end of the third switch circuit 190 is electrically connected to the pixel electrode 120.

A first capacitor 180 is formed between the drain end of the first switch circuit 170 and the drain end of the second triode 161; a storage capacitor $C_{st}$ is formed between the drain end of the third switch circuit 190 and an array substrate of the display panel 101, and a pixel capacitor $C_{lc}$ is formed between the drain end of the third switch circuit 190 and a color film substrate of the display panel 101.

In this solution, in the scanning period of a row of pixels, the scanning period of the row of pixels is divided at four time points $T_1, T_2, T_3$, and $T_4$. It should be noted that a frame time (60 Hz T=1/60=16.7 ms, and 120 Hz T=8.33 ms) $T=(T_1+T_2+T_3+T_4)\cdot t$, where t is a quantity of gate lines, that is, a quantity of times of scanning performed in a frame time. For example, for a display panel 101 having a high definition HD resolution of 1366*768, there are 768 gate lines, t=768, and correspondingly, $T_1+T_2+T_3+T_4=21.7$ μs (for the case of 60 Hz, 60 Hz may also be 120 Hz, and a scanning time t in a 120 Hz case is equal to 10.85 μs). For a display panel 101 having a full high definition resolution, t=1080, and correspondingly, $T_1+T_2+T_3+T_4=15.4$ μs. For a display panel 101 having a 4K resolution, t=2160, and correspondingly, $T_1+T_2+T_3+T_4=7.7$ μs.

In this solution, in the time $T_1$, an initialization action is performed, the Gate 1 is at a high level VGH, the Gate 2 is at a low level VGL, and in this case, T3 is turned on, T1 is turned off, and the node m is at a high level when a previous frame ends, so that T2 is turned on. In this case, $V_{DD}$ sends a low-level signal $V_{DD\_L}$ ($V_{DD}$ is a signal sent by a control chip on the drive circuit to directly control a high/low level signal of the display panel 101, where the drive circuit is electrically connected to the display panel 101 by using a separate lead). Therefore, in this case, voltages of nodes n/o are $V_n=V_o=V_{DD\_L}$. At the time $T_2$, data signal writing is performed, and in this case, the Gate 2 is pulled up to VGH, and a data signal starts to be input. In this case, a voltage of a node m is $V_m=V_{Data}$, the Gate 1 remains at a $V_{HG}$ to enable T3 to be continuously turned on, the voltages of the nodes n and o are $V_n=V_o=V_{DD\_L}$, and in this case, the voltage of the capacitor C is $V_c=V_{Data}-V_{DD\_L}$. The time T3 is a voltage pulled-up stage, and in this case, the Gate 2 at this time is at a VGL, T1 is turned off, the node m is in a floating state, $V_{DD}$ is pulled up to $V_{DD\_H}$ from $V_{DD\_L}$, and a current flowing through T2 is $I_2=k(V_{Data}-V_{DD\_L}-V_{th2})$;

The voltages of the nodes m/n/o are respectively:

$$V_m = \frac{k(V_{Data} - V_{DD\_L} - V_{th2})^2 \times T_3}{C_{st} + C_{lc}} + V_{Data}$$

-continued $$V_n = V_o = \frac{k(V_{Data} - V_{DD\_L} - V_{th2})^2 \times T_3}{C_{st} + C_{lc}} + V_{DD\_L}$$

T is a time length of $T_3$, and $V_{th2}$ is a threshold voltage of T2. The time $T_4$ is the last light emitting phase, and in this case, the Gate 1 and the Gate 2 are both at a VGL. T1 and T3 are turned off at the same time, and in this case, the voltage of the node m is at a high potential to enable T2 to be turned on. The node n may be charged to $V_{DD\_H}$ by T2 that is turned on, and in this case, the node o can still remain at the high potential after T3 is turned off. K is a constant related to a mobility rate of a semiconductor layer. $k=\frac{1}{2}*\mu*C_{ox}*W/L$, $\mu$ is an electronic mobility rate of a semiconductor layer, $C_{ox}$ is capacitance per unit area of a TFT device in an MIS structure, and W/L is a width to length ratio of a TFT channel.

The first scanning line of the display panel 101 outputs the first scanning signal Gate 1 corresponding to the current pixel. When the first scanning signal Gate 1 is at a high level, the first switch circuit 170 is conducted, the data line 140 inputs the data voltage $V_{Data}$ to the output end of the first switch circuit 170 by using the first switch circuit 170, and the power supply circuit 150 is enabled to be at a low level $V_{DD\_L}$. In this case, the data voltage charges the first capacitor 180, the point m is at a high level, the second triode 161 is turned on, and the point n is at a $V_{DD\_L}$. In this case, the voltage at the first capacitor 180 is: $V_c=V_{Data}-V_{DD\_L}$. In this case, the first scanning signal Gate 1 is set to be at a low level $V_{DD\_L}$, the power supply circuit 150 is enabled to be at a high level $V_{DD\_H}$ to charge the second triode 161, to amplify an input of the gate end of the second triode 161, and in this case, a current flowing through the second triode T2 is $I_2=k(V_{Data}-V_{DD\_L}-V_{th2})$, and the voltage of the output end of the second triode 161, that is, the voltage of the node n is:

$$V_n = V_o = \frac{k(V_{Data} - V_{DD\_L} - V_{th2})^2 \times T_3}{C_{st} + C_{lc}} + V_{DD\_L}$$

$V_{th2}$ is a threshold voltage of T2, and k is a constant related to a mobility rate of a semiconductor layer. $k=\frac{1}{2}*\mu*C_{ox}*W/L$, $\mu$ is an electronic mobility rate of the semiconductor layer, $C_{ox}$ is capacitance per unit area of a TFT device in an MIS structure, and W/L is a width to length ratio of a TFT channel. Because in this case, the node m is in a floating state, the first capacitor 180 maintains a voltage difference at the two ends of the capacitor. When the voltage of the output end of the amplification circuit 160 is amplified, the voltage of the drain end of the first switch circuit 170 is pulled up at the same time, and the voltage of the drain end of the first switch circuit 170 is maintained and enhanced, that is:

$$V_m = \frac{k(V_{Data} - V_{DD\_L} - V_{th2})^2 \times T_3}{C_{st} + C_{lc}} + V_{Data}$$

In this case, the second scanning signal Gate 2 is set to be at a high level, and $V_m$ charges the pixel electrode 120 by using the third switch circuit 190, so that the pixel electrode 120 can maintain a higher pixel drive voltage related to the data voltage of the data line 140 in a frame period. In this case, the first scanning signal Gate 1 is set to be at a low level, so that the first switch circuit 170 disconnects a connection between the data line 140 and the amplification circuit, preventing the second triode 161 and the data line 140 from continuously affecting the voltage of the pixel electrode 120.

The technical solution of this application may be widely applied to flat-panel displays such as a TFT-LCD, an OLED display, and the like.

The foregoing contents are detailed descriptions of this application in conjunction with specific optional embodiments, and it should not be considered that the specific implementation of this application is limited to these descriptions. Persons of ordinary skill in the art can further make simple deductions or replacements without departing from the concept of this application, and such deductions or replacements should all be considered as falling within the protection scope of this application.

What is claimed is:
1. A display device, comprising:
a display panel;
a drive circuit, configured to drive the display panel; and
a pixel drive circuit, comprising:
a pixel electrode;
a data line, configured to provide a data voltage of the current pixel in cooperation with the first scanning signal;
a power supply circuit, comprising a power supply voltage line, and configured to provide a power supply voltage; and
an amplification circuit, comprising a second triode, wherein a gate end of the second triode is in control connection with the data line, a source end of the second triode is electrically connected to the power supply voltage line, a drain end of the second triode in control connection with the pixel electrode, and the amplification circuit amplifies the data voltage provided by the data line and outputs the amplified data voltage to the pixel electrode;
wherein the drive circuit outputs the first scanning signal, the power supply voltage, and the data voltage to the display panel; and
in a scanning period of a row of pixels on the display panel, the first scanning signal output by the drive circuit is at a high level, and provides the data voltage of the current pixel to the amplification circuit in cooperation with the data voltage of the data line; and the power supply voltage of the power supply circuit is at a high level and supplies power to the amplification circuit, and the amplification circuit amplifies the data voltage and outputs the amplified data voltage to the pixel electrode,
wherein the drive circuit further outputs a second scanning signal; and a scanning period of a row of pixels on the display panel comprises a first periodic time and a second periodic time;
in the first periodic time, the first scanning signal output by the drive circuit is at a high level, and the second scanning signal output by the drive circuit is at a high level; the power supply voltage is at a low level; and the data line outputs the data voltage corresponding to the current pixel; and
in the second periodic time, the first scanning signal output by the drive circuit is at a low level; and the second scanning signal output by the drive circuit is at a high level, and the power supply voltage is at a high level, wherein a scanning period of a row of pixels on the display panel comprises an initialization period set before the first periodic time, and in the initialization period, the first scanning signal output by the drive circuit is at a low level, and the second scanning signal output by the drive circuit is at a high level, wherein a scanning period of a row of pixels on the display panel comprises a third periodic time set after the second periodic time; and in the third periodic time, the first scanning signal output by the drive circuit is at a low level, and the second scanning signal output by the drive circuit is at a low level.

2. The display device according to claim 1, wherein the pixel drive circuit comprises a first switch circuit, and the data line is in control connection with the amplification circuit by using the first switch circuit; the data line is electrically connected to a source end of the first switch circuit, and a drain end of the first switch circuit is in control connection with the amplification circuit; and a gate end of the first switch circuit is in control connection with the first scanning signal of the display panel.

3. The display device according to claim 2, wherein a first capacitor is formed between the drain end of the first switch circuit and an output end of the amplification circuit.

4. The display device according to claim 1, wherein the pixel drive circuit further comprises:
a second scanning line, configured to provide a second scanning signal corresponding to the current pixel; and
a third switch circuit, wherein the third switch circuit is connected between an output end of the amplification circuit and the pixel electrode; and a gate end of the third switch circuit is electrically connected to the second scanning line, a source end of the third switch circuit is electrically connected to the output end of the amplification circuit, and a drain end of the third switch circuit is electrically connected to an input end of the pixel electrode.

5. The display device according to claim 4, wherein the first switch circuit comprises a first thin film transistor, and the third switch circuit comprises a third thin film transistor;
a gate end of the first thin film transistor is in control connection with the first scanning signal; and a source end of the first thin film transistor is electrically connected to the data line, and a drain end of the first thin film transistor is connected to a gate end of the second triode;
a source end of the second triode is electrically connected to the power supply voltage line, and a drain end of the second triode is electrically connected to a source end of the third thin film transistor;
a gate end of the third thin film transistor is in control connection with the second scanning signal and a drain end of the third thin film transistor is electrically connected to an input end of the pixel electrode; and
a first capacitor is formed between a drain end of the first switch circuit and the drain end of the second triode.

* * * * *